United States Patent
Horiuchi et al.

(10) Patent No.: US 6,670,739 B2
(45) Date of Patent: Dec. 30, 2003

(54) SURFACE ACOUSTIC WAVE APPARATUS

(75) Inventors: Hideya Horiuchi, Nagaokakyo (JP); Mamoru Ikeura, Nagaokakyo (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 113 days.

(21) Appl. No.: 10/052,507

(22) Filed: Jan. 23, 2002

(65) Prior Publication Data
US 2003/0107297 A1 Jun. 12, 2003

(30) Foreign Application Priority Data
Mar. 2, 2001 (JP) ......... 2001-058854

(51) Int. Cl.[7] ......... H01L 41/00; H01L 41/047; H01L 41/053; H01L 41/08
(52) U.S. Cl. ......... 310/313 R; 310/365; 310/364
(58) Field of Search ......... 310/313 R, 364, 310/365, 313 B; 333/133, 193

(56) References Cited

U.S. PATENT DOCUMENTS

| | | | | |
|---|---|---|---|---|
| 4,205,285 A | * | 5/1980 | Dempsey et al. | 310/313 C |
| 4,381,469 A | | 4/1983 | Ogawa et al. | 310/313 R |
| 5,767,603 A | * | 6/1998 | Kadota et al. | 310/313 B |
| 6,127,769 A | * | 10/2000 | Kadota et al. | 310/313 B |
| 6,150,900 A | * | 11/2000 | Kadota et al. | 310/313 B |
| 6,310,524 B1 | * | 10/2001 | Ago et al. | 310/313 B |
| 6,323,730 B1 | * | 11/2001 | Hynd | 330/85 |
| 6,335,584 B1 | * | 1/2002 | Kadota et al. | 310/313 B |
| 6,346,864 B1 | * | 2/2002 | Kadota | 310/313 B |
| 6,356,167 B1 | * | 3/2002 | Kadota et al. | 310/313 A |
| 6,366,002 B1 | * | 4/2002 | Kadota | 310/313 R |
| 6,377,139 B1 | * | 4/2002 | Horiuchi et al. | 333/193 |

FOREIGN PATENT DOCUMENTS

| | | | | |
|---|---|---|---|---|
| JP | 56-16312 | | 2/1981 | H03H/9/25 |
| JP | 2-15388 | | 4/1990 | H03H/9/145 |
| JP | 04356980 A | * | 12/1992 | H01L/41/113 |
| JP | 05055660 A | * | 3/1993 | H01L/41/09 |
| JP | 06168624 A | * | 6/1994 | H01L/41/08 |
| JP | 09159690 A | * | 6/1997 | H01L/41/08 |
| JP | 2000059165 A | * | 2/2000 | H01L/41/09 |

* cited by examiner

Primary Examiner—Karl Tamai
Assistant Examiner—J. Aguirrechea
(74) Attorney, Agent, or Firm—Keating & Bennett, LLP

(57) ABSTRACT

A SAW apparatus includes a plurality of IDTs disposed on a piezoelectric substrate, and an edge-reflection-type SAW device in which surface acoustic waves are reflected by the edge surfaces of the piezoelectric substrate. The SAW device is housed in a package. On the top of a first main surface of the piezoelectric substrate, first and second pyroelectric charge cancellation electrodes are disposed in the vicinity of the edges defined by the main surface and the side surfaces. The first and second pyroelectric charge cancellation electrodes are electrically connected to the electrodes on the package which are electrically connected to each other within the package, respectively. Therefore, the adverse effects of pyroelectric charge which is generated due to a rapid change in temperature is minimized.

21 Claims, 4 Drawing Sheets

SURFACE ACOUSTIC WAVE APPARATUS

BACKGROUND OF THE INVENTION

1. Field of the Invention

The present invention relates to a surface acoustic wave (SAW) apparatus having a SAW device that includes a piezoelectric substrate having pyroelectric properties and which is housed in a package. More particularly, the present invention relates to an edge-reflection-type SAW apparatus having a mechanism for preventing deterioration in performance or electrode damage due to a pyroelectric effect.

2. Description of the Related Art

When a surface acoustic wave (SAW) apparatus including a piezoelectric substrate having pyroelectric properties experiences a rapid change in temperature, a charge caused by the pyroelectric effect is generated on the piezoelectric substrate. This might result in discharging between a plurality of electrodes disposed on the piezoelectric substrate, causing damage to the electrodes. If the piezoelectric substrate is made of a piezo-ceramic, the piezoelectricity of the piezoelectric substrate is significantly reduced.

In order to solve the foregoing problems caused by the pyroelectric effect, a variety of proposals have been made. A SAW apparatus 101 shown in FIG. 4 is disclosed in Japanese Utility Model Publication No. 2-15388. In this apparatus 101, an interdigital transducer (IDT) 103, and reflectors 104 and 105 are disposed on the top of a piezoelectric substrate 102. A short-circuited electrode 106 having a rectangular band shape is disposed on the top of piezoelectric substrate 102 along its outer periphery. The technique described in this publication prevents dust that is scattered during manufacturing from adhering to electrodes such as the IDT 103 because of static electricity or pyroelectric charge generated during the heating step when a SAW device 101 is bonded to a package.

A SAW device 111 shown in FIG. 5 is disclosed in Japanese Unexamined Patent Application Publication No. 56-16312. A piezoelectric substrate 112 is polarized in the direction indicated by an arrow P. IDTs 113 and 114 are disposed on the top of the piezoelectric substrate 112. In order to prevent deterioration in piezoelectricity due to the pyroelectric effect in the case where the piezoelectric substrate 112 is made of a piezo-ceramic, conductive members 115 and 116 are disposed on ends 112a and 112b of the piezoelectric substrate 112, respectively, so as to extend perpendicular to the polarization direction. The conductive members 115 and 116 are electrically connected to a lead 117. Japanese Unexamined Patent Application Publication No. 56-37723 also discloses a SAW device having the same construction as in Japanese Unexamined Patent Application Publication No. 56-16312.

However, there are problems associated with the above-described techniques of the related art.

The SAW apparatus disclosed in Japanese Utility Model Publication No. 2-15388 requires the band-shaped short-circuited electrode 106 disposed around the periphery of the piezoelectric substrate 112. Therefore, the SAW apparatus of this type cannot be implemented as, for example, an edge-reflection-type SAW apparatus 121 shown in FIG. 6 which uses a Shear Horizontal ("SH") surface acoustic wave. The edge-reflection-type SAW apparatus 121 requires electrode fingers along facing ends 122a and 122b of a piezoelectric substrate 122 or in the vicinity of the ends 122a and 122b. Therefore, the short-circuited electrode described in Japanese Utility Model Publication No. 2-15388 cannot be located along the outer periphery of the piezoelectric substrate 122.

The SAW apparatus disclosed in Japanese Unexamined Patent Application Publication No. 56-16312 or No. 56-37723 requires the steps of, first, forming an electrode on the top of a mother piezoelectric substrate, cutting the piezoelectric substrate 112 therefrom by dicing, and then forming the conductive members 115 and 116 on the edges 112a and 122b of the piezoelectric substrate 112. Therefore, an additional manufacturing step is necessary, thereby increasing the cost, time and difficulty of manufacturing.

SUMMARY OF THE INVENTION

In order to overcome the above-described problems with the related art, preferred embodiments of the present invention provide an edge-reflection-type SAW apparatus that eliminates the adverse effects of a pyroelectric charge due to a rapid change in temperature without requiring any additional manufacturing step.

According to a preferred embodiment of the present invention, a SAW apparatus includes a piezoelectric substrate having pyroelectric properties and having first and second main surfaces opposing each other, first and second sides opposing each other, and first and second ends opposing each other, at least one IDT disposed on the first main surface of the piezoelectric substrate for propagating surface acoustic waves in the direction that is substantially perpendicular to the first and second sides, the surface acoustic waves being reflected by the first and second sides, a SAW device disposed on the first main surface of the piezoelectric substrate, the SAW device including a first pyroelectric charge cancellation electrode in the vicinity of an edge defined by the first end and the first main surface, and a second pyroelectric charge cancellation electrode in the vicinity of an edge defined by the second end and the first main surface, and a package which houses the SAW device and which includes a plurality of electrodes which are electrically connected to the SAW device. The first and second pyroelectric charge cancellation electrodes are electrically connected via the electrodes on the package rather than directly on the piezoelectric substrate.

The first and second pyroelectric charge cancellation electrodes are not located on the first and second sides of the piezoelectric substrate, respectively, but in the vicinity of the edge defined by each of the first and second ends and the first main surface. The first and second pyroelectric charge cancellation electrodes are located in a region other than in or around the SAW propagation pass, and therefore, the performance of the SAW apparatus is not influenced by the pyroelectric charge cancellation electrodes. Since the first and second pyroelectric charge cancellation electrodes are electrically connected via the electrodes on the package, the pyroelectric charges having opposite polarities which are generated at both ends in the polarization direction are cancelled. Therefore, if temperature rapidly changes, pyroelectric charges do not damage the electrodes or deteriorate the performance of the SAW device on the piezoelectric substrate.

According to another preferred embodiment of the present invention, the SAW device is disposed on the piezoelectric substrate, and has a plurality of electrode patterns connected to the at least one IDT, the plurality of electrode patterns are electrically connected to the plurality of electrodes on the package, and the first and second pyroelectric charge cancellation electrodes are electrically connected to different electrodes of the electrodes on the package via different electrode patterns of the electrode patterns on the piezoelectric substrate, the different electrodes on the package being electrically connected within the package. The first and second pyroelectric charge cancellation electrodes are electrically connected to different electrodes on the package via the electrode patterns which are used to electrically connect the IDTs to the electrodes on the package. Therefore, there is no need for any additional electrically connecting member, such as a bonding wire, for electrically connecting the first and second pyroelectric charge cancellation electrodes to the electrodes on the package.

The first and second pyroelectric charge cancellation electrodes may be arranged along the edge defined by each of the first and second ends and the first main surface. Alternatively, the first and second pyroelectric charge cancellation electrodes may be separated from the edges.

In another preferred embodiment of the present invention, the SAW device may be electrically connected to the plurality of electrodes on the package by a plurality of bonding wires. The first and second pyroelectric charge cancellation electrodes may be bonded to different electrodes on the package by the bonding wires. Otherwise, if the first and second pyroelectric charge cancellation electrodes are electrically connected to the electrode patterns connected to the IDTs, the electrode patterns may be electrically connected to the electrodes on the package by the bonding wires.

In another preferred embodiment of the present invention, the piezoelectric substrate is made of a piezo-ceramic. A piezo-ceramic significantly generates the pyroelectric effect due to a change in temperature. The SAW apparatus constructed according to various preferred embodiments of the present invention effectively prevents the adverse effects of the pyroelectric effect which is susceptible to the piezo-ceramic.

In another preferred embodiment of the present invention, a communication apparatus includes the SAW apparatus in accordance with other preferred embodiments of the present invention, with the SAW apparatus defining a bandpass filter of the communication apparatus. As a result, the communication apparatus eliminates the adverse effects of the pyroelectric effect which is generated on the piezoelectric substrate due to a rapid change in temperature. Therefore, the risk of electrode damage or deterioration in performance of the bandpass filter is minimized. The communication apparatus is therefore highly reliable and provides stable performance.

Other features, elements, characteristics and advantages of the present invention will become more apparent from the following detailed description of the preferred embodiments thereof with reference to the attached drawings.

DETAILED DESCRIPTION OF PREFERRED EMBODIMENTS

The present invention will be described with reference to the drawings and specific preferred embodiments of the present invention.

Figure 1:
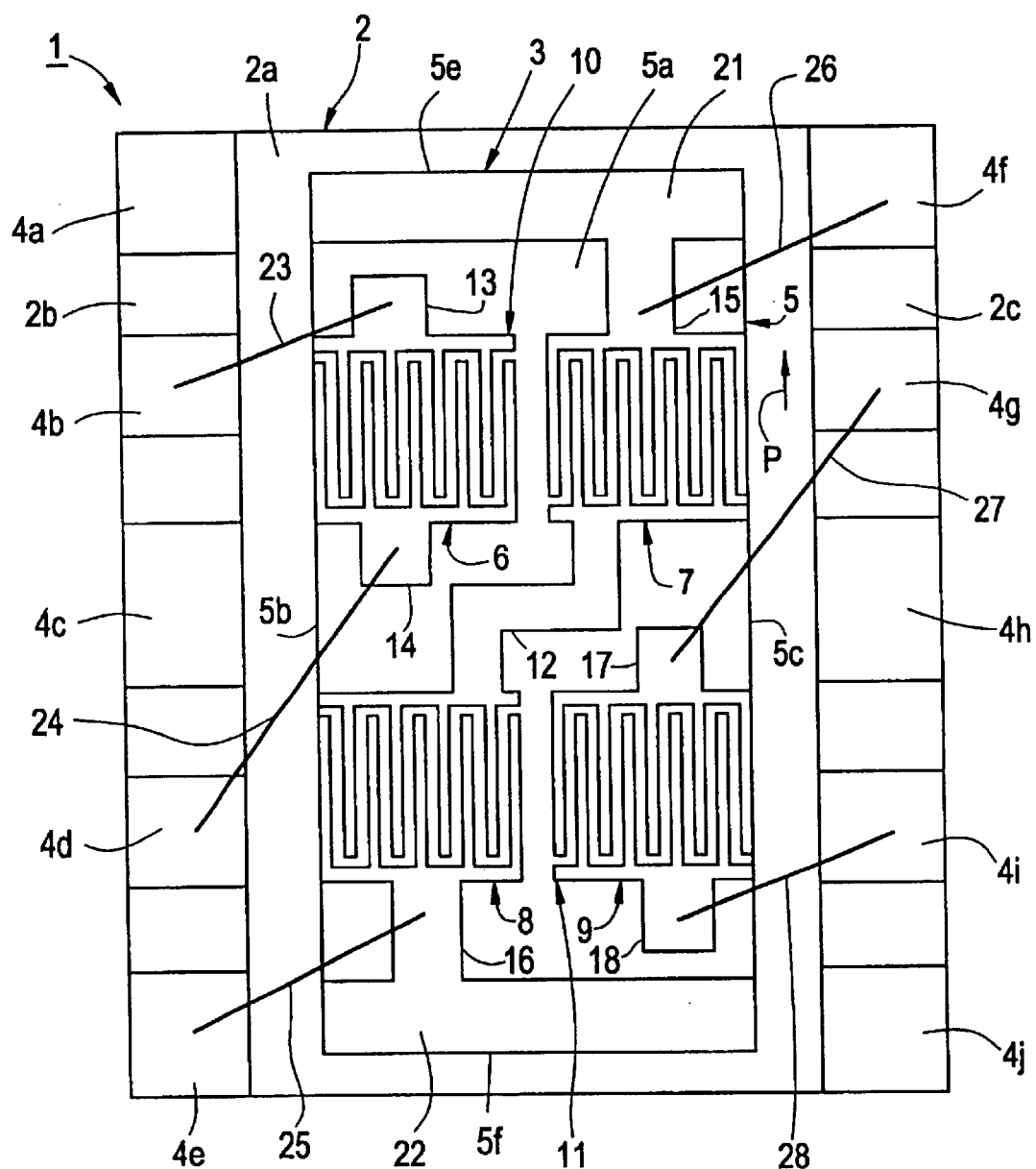
FIG. 1 is a schematic plan view of a SAW apparatus according to a first preferred embodiment of the present invention.

FIG. 1 is a schematic plan view showing, in cross section, a SAW apparatus 1 according to a first preferred embodiment of the present invention.

The SAW apparatus 1 preferably includes a package 2 and a SAW device 3.

The package 2 preferably has a recess 2a for receiving the SAW device 3 therein. In the schematic diagram of FIG. 1, a cover member (not shown) is attached to close the recess 2a.

Projecting steps 2b and 2c extend substantially parallel to each other at both sides of the recess 2a.

Electrodes 4a to 4e are disposed on the step 2b, and electrodes 4f to 4j are disposed on the step 2c.

The electrode 4b is used as an input-side signal terminal, and the electrode 4d is used as an input-side ground terminal. The electrode 4i is used as an output-side signal terminal, and the electrode 4g is used as an output-side ground terminal.

The SAW device 3 preferably includes a substantially rectangular piezoelectric substrate 5. In the first preferred embodiment, the piezoelectric substrate 5 is preferably made of a piezo-ceramic such as the lead zirconate titanate family of ceramic. If the piezoelectric substrate 5 is made of a piezo-ceramic, the piezoelectric substrate 5 is polarized in the direction indicated by an arrow P. The piezoelectric substrate 5 may be made of a single-crystal piezoelectric material having pyroelectric properties, such as $LiTaO_3$ or $LiNbO_3$, or other suitable material.

The piezoelectric substrate 5 has a first main surface 5a, and a second main surface which faces the first main surface 5a. The piezoelectric substrate 5 further has first and second sides 5b and 5c opposing each other, and first and second ends 5e and 5f opposing each other. IDTs 6 and 7 are aligned on the first main surface 5a in the direction that is substantially perpendicular to the polarization direction P. IDTs 8 and 9 are separated from the IDTs 6 and 7 in the polarization direction P. The IDTs 8 and 9 are also aligned in the direction that is substantially perpendicular to the polarization direction P.

The electrode fingers of the IDTs 6 to 9 extend substantially parallel to the polarization direction P.

The IDTs 6 and 7 define a first edge-reflection-type SAW filter 10 based on longitudinally coupled resonators. The IDTs 8 and 9 define a second edge-reflection-type SAW filter 11 based on longitudinally coupled resonators.

The first and second longitudinally coupled resonator SAW filters 10 and 11 propagate surface acoustic waves in the direction that is substantially perpendicular to the electrode fingers, i.e., in the direction extending between the side 5b and the side 5c. Because of the edge-reflection-type SAW filters 10 and 11 based on longitudinally coupled resonators, the electrode fingers of the IDTs 6 and 8 which are near the side 5b follow the edge defined by the side 5b and the first main surface 5a. Likewise, the electrode fingers of the IDTs 7 and 9 which are near the side 5c follow the edge defined by the side 5c and the first main surface 5a. Therefore, the SAW device 3 has no room to have a short-circuited electrode or other element in or around the SAW propagation path.

The IDT 7 of the first longitudinally coupled resonator SAW filter 10 is electrically connected to the IDT 8 of the second longitudinally coupled resonator SAW filter 11 via an electrode pattern 12.

In the first longitudinally coupled resonator SAW filter 10, a first end of the IDT 6 extends to an electrode pattern 13 in a continuous manner, and a second end extends to an electrode pattern 14 in a continuous manner. The electrode pattern 13 is an input-side signal electrode, and the electrode pattern 14 is an input-side ground electrode. A first end of the IDT 7 connects to an electrode pattern 15, and a second end connects to the electrode pattern 12.

In the second longitudinally coupled resonator SAW filter 11, a first end of the IDT 8 connects to the electrode pattern 12, and a second end electrically connects to an electrode pattern 16. A first end of the IDT 9 connects to an electrode pattern 17, and a second end connects to an electrode pattern 18. The electrode pattern 18 defines an output-side signal electrode, and the electrode pattern 17 defines an output-side ground electrode.

In this way, the first and second longitudinally coupled resonator SAW filters 10 and 11 are longitudinally connected to each other.

As a feature of the first preferred embodiment of the present invention, a first pyroelectric charge cancellation electrode 21 is preferably disposed on the top of the first main surface 5a of the piezoelectric substrate 5 so as to extend along the edge defined by the first main surface 5a and the first end 5e. A second pyroelectric charge cancellation electrode 22 is preferably disposed on the top of the first main surface 5a so as to extend along the edge defined by the first main surface 5a and the second end 5f. The first and second pyroelectric charge cancellation electrodes 21 and 22 are connected to the electrode patterns 15 and 16, respectively, that is, different electrode patterns.

The SAW element 3 is electrically connected to the electrodes 4b, 4d, 4e, 4f, 4g, and 4i on the package 2 preferably by a plurality of bonding wires 23 to 28.

More specifically, the electrode pattern 13 functioning as an input-side signal electrode is connected to the electrode 4b on the package 2 by the bonding wire 23. The electrode pattern 14 functioning as an input-side ground electrode is connected to the electrode 4d on the package 2 by the bonding wire 24. The electrode pattern 15 connected to the first end of the IDT 7 and to the first pyroelectric charge cancellation electrode 21 is electrically connected to the electrode 4f by the bonding wire 26. The electrode pattern 16 connected to the IDT 8 of the second longitudinally coupled resonator SAW filter 11 is connected to the electrode 4e by the bonding wire 25. The second pyroelectric charge cancellation electrode 22 is also electrically connected to the electrode pattern 16.

Although not specifically illustrated in FIG. 1, the electrodes 4e and 4f are electrically connected to each other within the package 2. Hence, the first and second pyroelectric charge cancellation electrodes 21 and 22 are electrically connected to each other via the electrode patterns 15 and 16, the bonding wires 25 and 26, and the electrodes 4e and 4f on the package 2.

The electrode pattern 17 connected to the first end of the IDT 9 is connected to the electrode 4g by the bonding wire 27. The electrode pattern 18 is electrically connected to the electrode 4i on the output side by the bonding wire 28.

When the SAW apparatus 1 in the first preferred embodiment undergoes a rapid change in temperature, a charge caused by the pyroelectric effect is generated. The pyroelectric charge concentrates at both ends in the polarization direction P to provide opposite polarities. The first and second pyroelectric charge cancellation electrodes 21 and 22 are positioned at both ends in the polarization direction P and are connected to the electrodes 4e and 4f on the package 2 which are electrically connected to each other, allowing the pyroelectric charges having opposite polarities to be cancelled. Therefore, the risk of electrode damage or deterioration in piezoelectricity of the piezoelectric substrate 5 due to a rapid change in temperature is eliminated.

A SAW apparatus in which the first and second pyroelectric charge cancellation electrodes 21 and 22 are separated from the edges defined by the first main surface 5a of the piezoelectric substrate 5 and each of the first and second ends 5e and 5f would also provide the advantage of eliminating the adverse effects of the pyroelectric effect, as in the SAW apparatus according to the first preferred embodiment.

Figure 2:
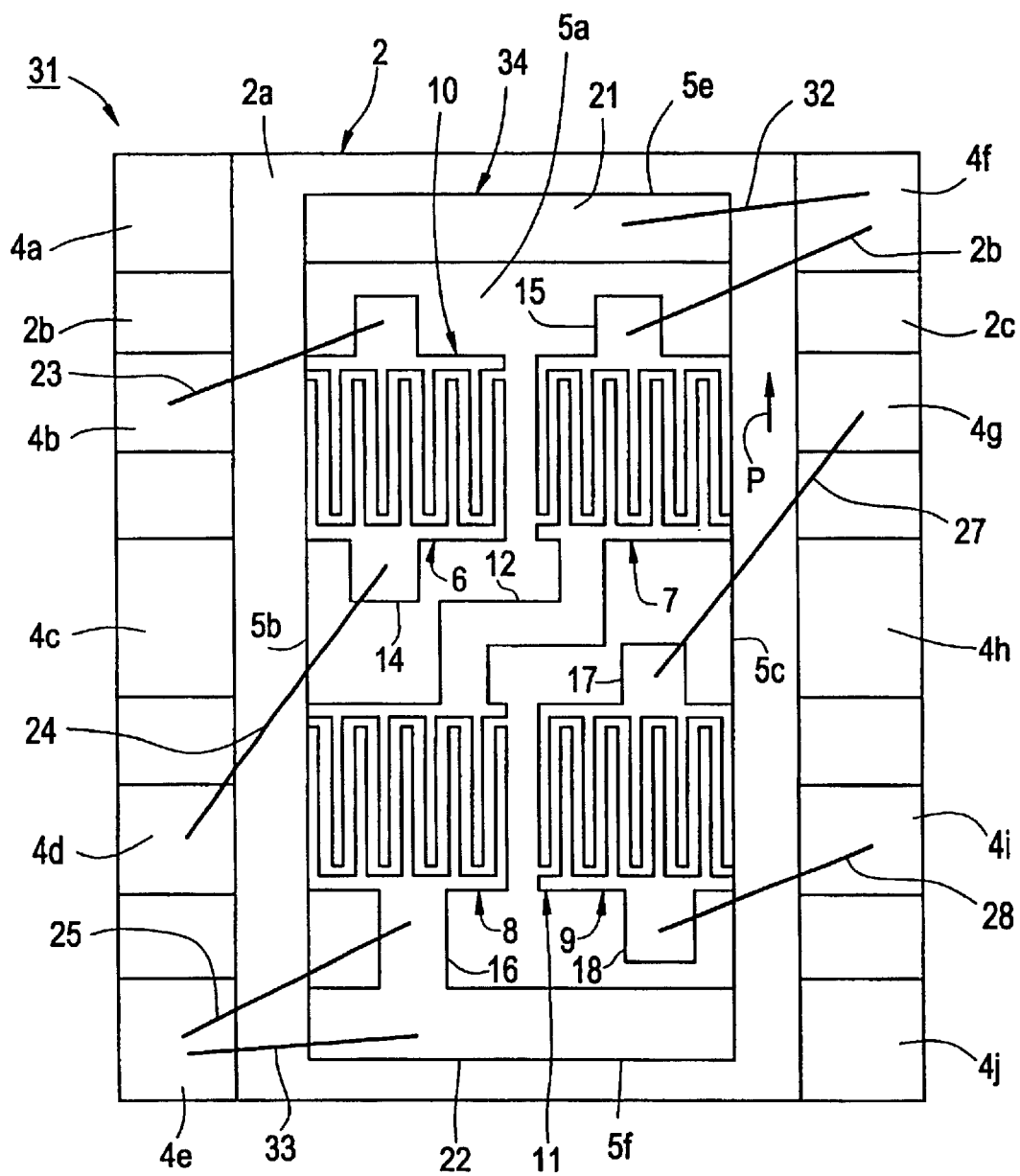
FIG. 2 is a schematic plan view of a SAW apparatus according to a second preferred embodiment of the present invention.

FIG. 2 is a plan view of a SAW apparatus 31 according to a second preferred embodiment of the present invention. The SAW apparatus 31 includes a SAW device 34 disposed in a package 2. The package 2 preferably has the same structure as that of the package 2 in the first preferred embodiment. The same or similar elements as those in the first preferred embodiments are identified by the same reference numerals, and the description thereof is omitted to avoid repetition.

The SAW device 34 preferably has substantially the same construction as that of the SAW device 3 in the first preferred embodiment, except that the first and second pyroelectric charge cancellation electrodes 21 and 22 are isolated from the electrode patterns 15 and 16, respectively.

The first pyroelectric charge cancellation electrode 21 is electrically connected to the electrode 4f by a bonding wire 32, and the second pyroelectric charge cancellation electrode 22 is electrically connected to the electrode 4e by a bonding wire 33.

The structure and arrangement of the other elements are the same as that in the first preferred embodiment.

In the second preferred embodiment, the dedicated bonding wires 32 and 33 may be used to electrically connect the first and second pyroelectric charge cancellation electrodes 21 and 22 to the electrodes 4f and 4e on the package 2, respectively.

The first preferred embodiment is more preferable than the second preferred embodiment because fewer bonding wires used are required in the first preferred embodiment.

In the first or second preferred embodiment, the electrode patterns or the first and second pyroelectric charge cancellation electrodes are electrically connected to the electrodes on the package by the bonding wires. However, any other electrically connecting member may be used instead of the bonding wires. For example, electrodes corresponding to the electrodes 4a to 4j are preferably disposed inside the recess 2a of the package 2, and the electrode patterns or pyroelectric charge cancellation electrodes of the SAW device 3 or 34 are positioned so as to face the electrodes inside the recess 2a of the package 2 from the first main surface 5a. The electrodes within the recess 2a are electrically connected to the electrode patterns or pyroelectric charge cancellation electrodes by a conductive adhesive, bumps, or other suitable connection members.

Although the SAW device 3 or 34 in the first or second preferred embodiment uses a longitudinally coupled resonator filter having two longitudinally coupled stages, the present invention is not limited thereto. An edge-reflection-type SAW device may be applied to a SAW apparatus that uses any of various SAW devices such as laterally coupled resonator SAW filters, ladder type filters, and SAW resonators.

The first and second pyroelectric charge cancellation electrodes 21 and 22 are provided for canceling out the pyroelectric charge, and are not necessarily made of high-conductivity films such as the electrode patterns 13 to 18. As long as the pyroelectric charge can migrate, the first and second pyroelectric charge cancellation electrodes 21 and 22 may be made of a low-conductivity material.

A communication apparatus including at least one of the SAW apparatuses in accordance with the above-described preferred embodiments of the present invention defining a bandpass filter of the communication apparatus is now described.

Figure 3:
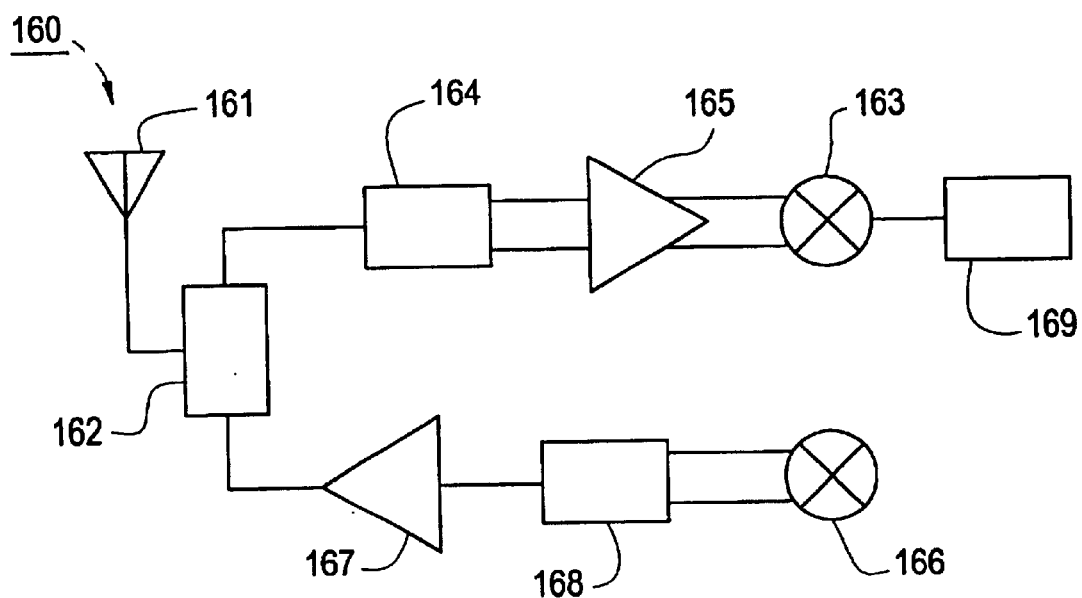
FIG. 3 is a schematic block diagram of a communication apparatus having the SAW apparatus in accordance with another preferred embodiment of the present invention.
Figure 4:
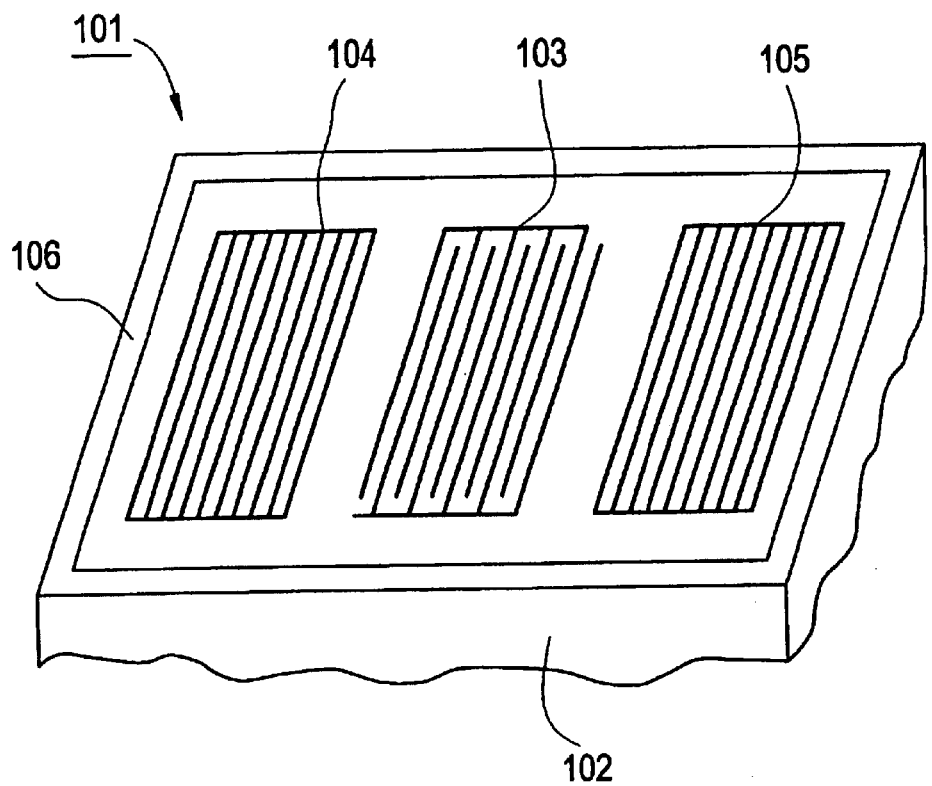
FIG. 4 is a perspective view of an example SAW device in the related art.
Figure 5:
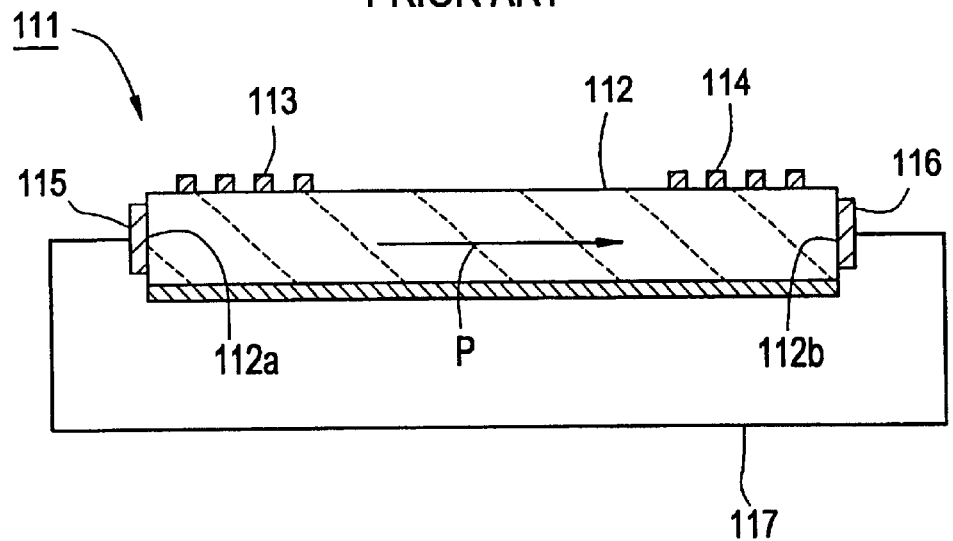
FIG. 5 is a schematic front cross-sectional view of another example SAW device in the related art.
Figure 6:
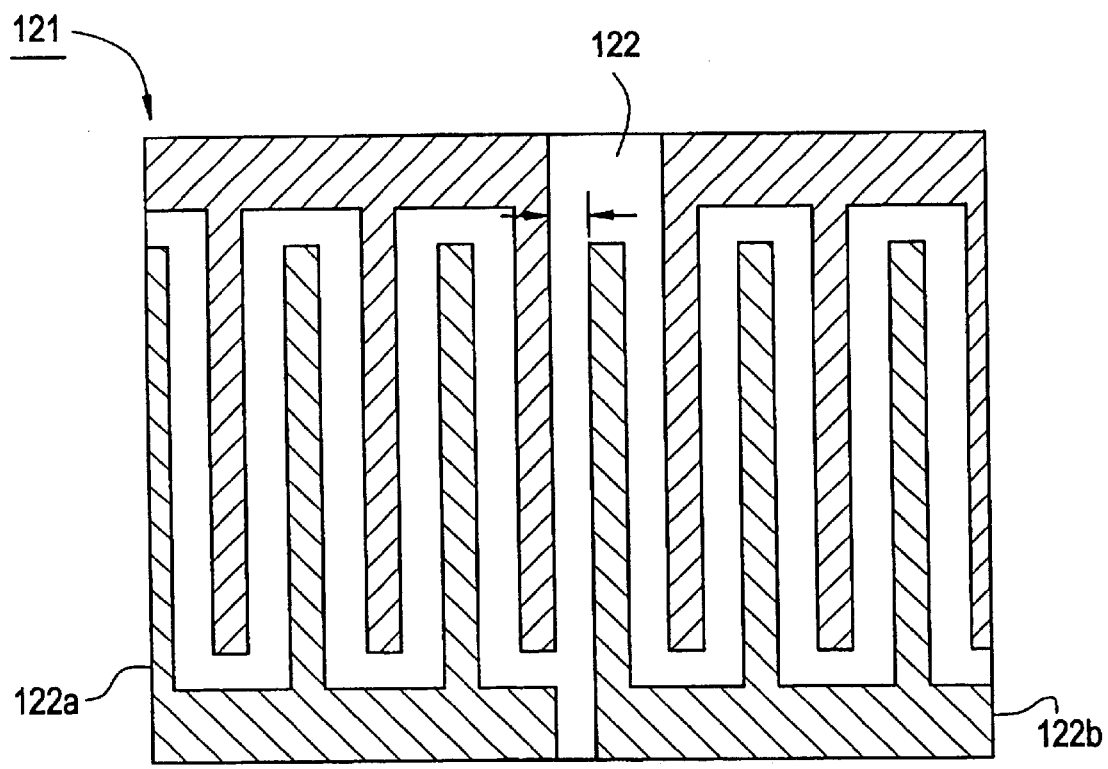
FIG. 6 is a plan view of an edge-reflection-type SAW device as well known in the art.

FIG. 3 is a schematic block diagram of a communication apparatus 160 including the SAW apparatus in accordance with various preferred embodiments of the present invention.

In FIG. 3, a duplexer 162 is connected to an antenna 161. A SAW filter 164 and an amplifier 165 which define the RF stage are connected to each other between the duplexer 162 and a receive mixer 163. A SAW filter 169 of the IF stage is connected to the mixer 163. An amplifier 167 and a SAW filter 168 which define the RF stage are connected to each other between the duplexer 162 and a transmission mixer 166.

The SAW apparatus in accordance with preferred embodiments of the present invention is suitable for the SAW filter 169 in the communication apparatus 160.

Accordingly, in a SAW apparatus according to preferred embodiments of the present invention, first and second pyroelectric charge cancellation electrodes are disposed in the vicinity of an edge defined by a first main surface and each of first and second ends which are different from first and second sides functioning as reflective surfaces of an edge-reflection-type SAW device. Therefore, the first and second pyroelectric charge cancellation electrodes are disposed in the vicinity of both ends of a piezoelectric substrate at both ends in the polarization direction. The first and second pyroelectric charge cancellation electrodes are electrically connected via electrodes on a package. In case of a rapid change in temperature, pyroelectric charges generated by the pyroelectric effect appear on the piezoelectric substrate at both ends in the polarization direction. However, the first and second pyroelectric charge cancellation electrodes are short circuited. Therefore, the risk of electrode damage or deterioration of electricity of the piezoelectric substrate due to the pyroelectric charge is eliminated. Accordingly, an edge-reflection-type SAW apparatus having a high reliability and having a desirable resonant characteristic or filter characteristic is achieved.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A SAW apparatus comprising:
    a piezoelectric substrate having pyroelectric properties and having first and second main surfaces opposing each other, first and second sides opposing each other, and first and second ends opposing each other;
    at least one IDT disposed on the first main surface of said piezoelectric substrate and arranged to propagate surface acoustic waves in a direction that is substantially perpendicular to the first and second sides, the surface acoustic waves being reflected by the first and second sides;
    a SAW device disposed on the first main surface of said piezoelectric substrate, said SAW device including a first pyroelectric charge cancellation electrode located near an edge defined by the first end and the first main surface, and a second pyroelectric charge cancellation electrode located near an edge defined by the second end and the first main surface; and
    a package housing said SAW device and which includes a plurality of electrodes which are electrically connected to said SAW device;
    wherein the first and second pyroelectric charge cancellation electrodes are electrically connected via the electrodes on said package.

2. A SAW apparatus according to claim 1, wherein the first and second pyroelectric charge cancellation electrodes are not electrically connected directly on said piezoelectric substrate.

3. A SAW apparatus according to claim 1, wherein said SAW device is disposed on said piezoelectric substrate, and has a plurality of electrode patterns connected to the at least one IDT;
    the plurality of electrode patterns are electrically connected to the plurality of electrodes on said package; and
    the first and second pyroelectric charge cancellation electrodes are electrically connected to different electrodes of the electrodes on said package via different electrode patterns of the electrode patterns on said piezoelectric substrate, the different electrodes on said package being electrically connected within said package.

4. A SAW apparatus according to claim 1, wherein the first pyroelectric charge cancellation electrode is arranged to extend along the edge defined by the first end and the first main surface, and the second pyroelectric charge cancellation electrode is arranged to extend along the edge defined by the second end and the first main surface.

5. A SAW apparatus according to claim 1, wherein the first pyroelectric charge cancellation electrode is spaced from the edge defined by the first end and the first main surface, and the second pyroelectric charge cancellation electrode is spaced from the edge defined by the second end and the first main surface.

6. A SAW apparatus according to claim 1, further comprising a plurality of bonding wires arranged to electrically connect said SAW device to the electrodes on said package.

7. A SAW apparatus according to claim 1, wherein said piezoelectric substrate is made of a piezo-ceramic material.

8. A SAW apparatus according to claim 1, further comprising a plurality of interdigital electrode terminals arranged to define longitudinally coupled resonators.

9. A communication apparatus comprising at least one SAW apparatus according to claim 1, wherein the at least one SAW apparatus defines a bandpass filter.

10. A SAW apparatus comprising:
    a piezoelectric substrate having first and second main surfaces opposing each other, first and second sides opposing each other, and first and second ends opposing each other;
    at least one IDT disposed on the first main surface of said piezoelectric substrate and arranged to propagate surface acoustic waves in a direction that is substantially perpendicular to the first and second sides, the surface acoustic waves being reflected by the first and second sides via edge reflection;
    a SAW device disposed on the first main surface of said piezoelectric substrate, said SAW device including at least one pyroelectric charge cancellation electrode located near an edge of the piezoelectric substrate.

11. A SAW apparatus according to claim 10, further comprising a package housing said SAW device and which includes at least one electrode which is electrically connected to said SAW device.

12. A SAW apparatus according to claim 11, wherein the at least one pyroelectric charge cancellation electrode is electrically connected to the at least one electrode on said package.

13. A SAW apparatus according to claim 11, further comprising first and second pyroelectric charge cancellation electrodes which are electrically connected to each other via the at least one electrode on the package.

14. A SAW apparatus according to claim 13, wherein said first and second pyroelectric charge cancellation electrodes are not electrically connected directly on said piezoelectric substrate.

15. A SAW apparatus according to claim 13, wherein said SAW device is disposed on said piezoelectric substrate, and has a plurality of electrode patterns connected to the at least one IDT;

the plurality of electrode patterns are electrically connected to the plurality of electrodes on said package; and the first and second pyroelectric charge cancellation electrodes are electrically connected to different electrodes of the electrodes on said package via different electrode patterns of the electrode patterns on said piezoelectric substrate, the different electrodes on said package being electrically connected within said package.

16. A SAW apparatus according to claim 13, wherein the first pyroelectric charge cancellation electrode is arranged to extend along the edge defined by the first end and the first main surface, and the second pyroelectric charge cancellation electrode is arranged to extend along the edge defined by the second end and the first main surface.

17. A SAW apparatus according to claim 13, wherein the first pyroelectric charge cancellation electrode is spaced from the edge defined by the first end and the first main surface, and the second pyroelectric charge cancellation electrode is spaced from the edge defined by the second end and the first main surface.

18. A SAW apparatus according to claim 11, further comprising at least one bonding wire arranged to electrically connect said SAW device to the at least one electrode on said package.

19. A SAW apparatus according to claim 10, wherein said piezoelectric substrate is made of a piezo-ceramic material.

20. A SAW apparatus according to claim 10, further comprising a plurality of interdigital electrode terminals arranged to define longitudinally coupled resonators.

21. A communication apparatus comprising at least one SAW apparatus according to claim 10, wherein the at least one SAW apparatus defines a bandpass filter.

* * * * *